United States Patent [19]
Ohtani et al.

[11] Patent Number: 6,088,070
[45] Date of Patent: Jul. 11, 2000

[54] ACTIVE MATRIX LIQUID CRYSTAL WITH CAPACITOR BETWEEN LIGHT BLOCKING FILM AND PIXEL CONNECTING ELECTRODE

[75] Inventors: Hisashi Ohtani; Yasushi Ogata; Yoshiharu Hirakata, all of Kanagawa, Japan

[73] Assignee: Semiconductor Energy Laboratory Co., Ltd., Kanagawa-ken, Japan

[21] Appl. No.: 09/008,412

[22] Filed: Jan. 16, 1998

[30] Foreign Application Priority Data

Jan. 17, 1997 [JP] Japan .................................. 9-019825
Oct. 31, 1997 [JP] Japan .................................. 9-316567

[51] Int. Cl.7 .................................................. G02F 1/1343
[52] U.S. Cl. ................................ 349/38; 349/44; 349/111
[58] Field of Search .................................... 349/38, 39, 44, 349/110, 111, 139

[56] References Cited

U.S. PATENT DOCUMENTS

| | | | |
|---|---|---|---|
| 5,159,477 | 10/1992 | Shimada et al. ......................... | 349/39 |
| 5,708,485 | 1/1998 | Sato et al. ................................ | 349/42 |
| 5,745,195 | 4/1998 | Zhang ...................................... | 349/39 |
| 5,777,701 | 7/1998 | Zhang ...................................... | 349/44 |
| 5,818,552 | 10/1998 | Sato ......................................... | 349/43 |
| 5,899,548 | 5/1999 | Ishiguru .................................... | 349/47 |

*Primary Examiner*—Kenneth Parker
*Attorney, Agent, or Firm*—Fish & Richardson P.C.

[57] ABSTRACT

An conductive coating serves as a light shield film and is kept at a give voltage. A metal interconnection is located in the same layer as a source line and connected to the drain of a thin-film transistor. An interlayer insulating film is constituted of at least lower and upper insulating layers and formed between the conductive coating and the source line. According to one aspect of the invention, an auxiliary capacitor is formed by the metal interconnection and the conductive coating serving as both electrodes and at least the lower insulating layer film serving as a dielectric. The auxiliary capacitor is formed in a region of the interlayer insulating film in which the upper insulating layer has been removed by etching. According to another aspect of the invention, the conductive coating has a portion that is in contact with the lower insulating layer in a region where the conductive coating coextends with the metal interconnection.

21 Claims, 10 Drawing Sheets

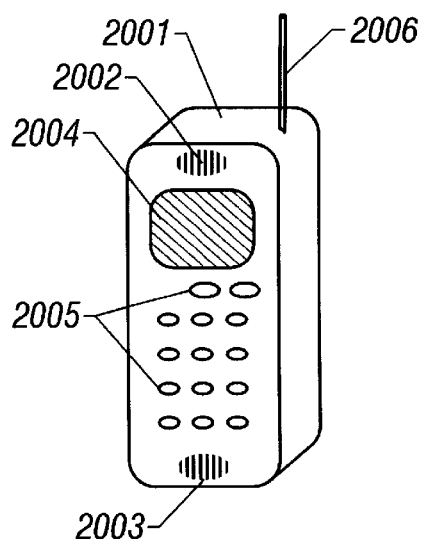
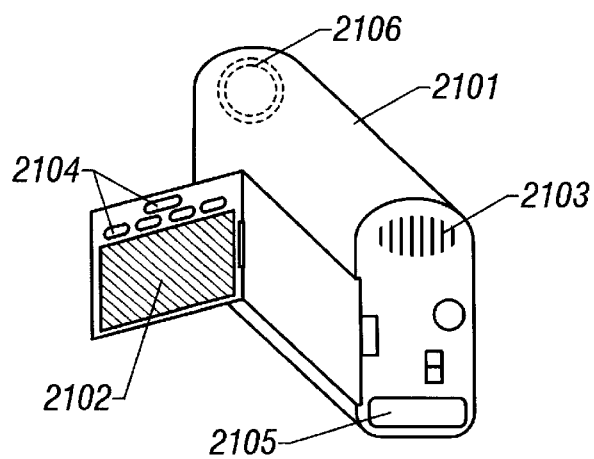
FIG. 13A  FIG. 13B
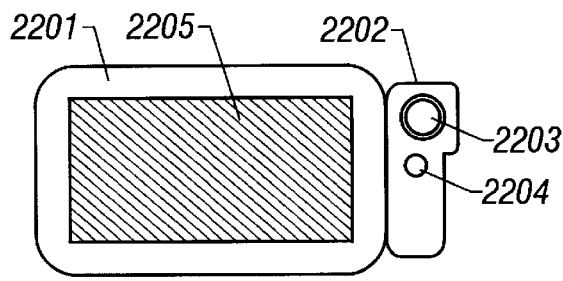
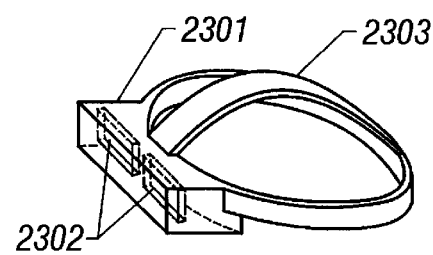
FIG. 13C  FIG. 13D
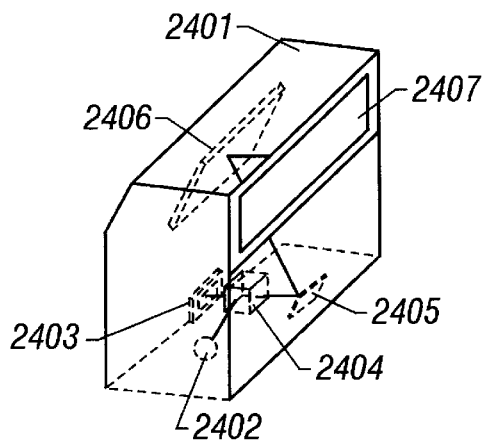
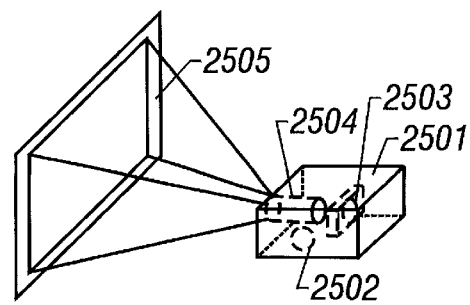
FIG. 13E  FIG. 12C

ACTIVE MATRIX LIQUID CRYSTAL WITH CAPACITOR BETWEEN LIGHT BLOCKING FILM AND PIXEL CONNECTING ELECTRODE

BACKGROUND OF THE INVENTION

1. Field of the Invention

The present invention relates to the circuit configuration and layout of a pixel area of an active matrix display device in which thin-film transistors are used and source lines are located over gate lines. In particular, the invention relates to the structure of an auxiliary capacitor.

2. Description of the Related Art

In recent years, because of increased demand for the active matrix liquid crystal display device, the techniques of forming thin-film transistors (TFTs) on an inexpensive glass substrate have been developed at high speed. In the active matrix liquid crystal display device, thin-film transistors are provided for tens to hundreds of millions of pixels arranged in matrix form, respectively, and charge to enter or exit from each pixel electrode is controlled by the switching function of the associated thin-film transistor.

A liquid crystal is interposed between each pixel electrode and the opposed electrode to constitute a capacitor. Therefore, by controlling charge to enter or exit from the capacitor with the thin-film transistor, the electro-optical characteristic of the liquid crystal is varied and the light passing through the liquid crystal panel is thereby controlled. Image display is performed in this manner.

However, the above-configured capacitor has a problem that the voltage held by itself gradually decreases as time elapses due to current leakage and a resulting variation in electro-optical characteristic deteriorates the contrast of image display. To solve this problem, another capacitor called "auxiliary capacitor" is commonly used to supply the capacitor including the liquid crystal with charge corresponding to charge that has been lost by leakage etc.

FIG. 1 is a circuit diagram of a conventional active matrix liquid crystal display device. The active matrix display circuit is generally divided into three parts: a gate driver circuit 2 for driving gate lines (scanning lines) 4, a data driver circuit 1 for driving source lines (data lines or signal lines) 5, and an active matrix circuit 3 in which pixels are provided. The data driver circuit 1 and the gate driver circuit 2 are generically called "peripheral circuits."

In the active matrix circuit 3, a large number of gate lines 4 and source lines 5 are provided so as to cross each other and pixel electrodes 7 are provided at their respective intersections. Switching elements (thin-film transistors) 6 are provided to control charges to enter or exit from the respective pixel electrodes. Either the top-gate thin-film transistor (the gate electrode is located over the active layer) or the bottom-gate thin-film transistor (the active layer is located over the gate electrode) is used depending on the desired circuit structure, manufacturing process, characteristics, and other factors. As described above, auxiliary capacitors 8 are provided parallel with the respective pixel capacitors to prevent voltage variations in the pixels due to leak current (see FIG. 1).

The conductivity of the thin-film transistor is varied when it is illuminated with light. To prevent this phenomenon, it is necessary to cover the thin-film transistor with a coating (black matrix or black mask) having light interrupting ability. The light-interruptive film needs to be formed also to prevent color or brightness mixture between adjacent pixels and a display failure due to electric field disorder at pixel boundaries.

For the above reasons, the light-interruptive film (hereinafter referred to as "light shield film") assumes a matrix form and is therefore called a black matrix (BM). Although at first the BM was provided on the substrate (opposed substrate) that confronts the substrate on which the active matrix circuit is provided because of advantages in a manufacturing process, it is now proposed that the BM be provided on the substrate on which the active matrix circuit is provided because of the need for increasing the area of each pixel (i.e., aperture ratio).

Although various proposals have been made of the structure of the auxiliary capacitor, it is difficult to obtain large capacitance while maintaining the pixel opening area (light transmitting area).

SUMMARY OF THE INVENTION

The present invention has been made in view of the above circumstances in the art and an object of the invention is therefore to provide an auxiliary capacitor having large capacitance while maintaining a necessary pixel opening area.

The invention attains the above object by forming a conductive light shield film on an active-matrix-side substrate and using it as an electrode of an auxiliary capacitor by keeping it at a given voltage. Since the light shield film does not transmit light, its use as the electrode of the auxiliary capacitor does not cause any reduction in aperture ratio.

According to the invention, an active matrix liquid crystal display device comprises:

(1) a thin-film transistor;
(2) a gate line and a source line formed thereon;
(3) a conductive coating serving as a light shield film and kept at a given voltage;
(4) a metal interconnection connected to the drain of the thin-film transistor and located in the same layer as the source line; and
(5) an interlayer insulating film provided between the conductive coating and the source line and constituted of at least two insulating layers.

In the invention, the thin-film transistor may be of either a top-gate type or a bottom-gate type as long as the above conditions are satisfied. This is because the main improvements of the invention relate to the structure above the source line and hence the structure below the source line (i.e., the positional relationship between the gate line and the active layer) is irrelevant. The laminate interlayer insulating film may be constituted of three or more layers.

According to a first aspect of the invention, in the above basic configuration, an auxiliary capacitor in which the metal interconnection (also called "auxiliary capacitor electrode") and the conductive coating (light shield film) serve as both electrodes and at least a lower insulating layer of the interlayer insulating film serves as a dielectric is formed in a region of the interlayer insulating film in which an upper insulating layer of the interlayer insulating film has been removed by etching. The dielectric may be constituted of two or more insulating layers.

According to a second aspect of the invention, in the above basic configuration, the conductive coating (light shield film) has a portion that is in contact with a lower insulating layer of the interlayer insulating film in a region where the conductive coating coextends with the metal interconnection.

In the first and second aspects of the invention, it is effective to make the lower insulating layer of the interlayer insulating film mainly of silicon nitride that can be produced stably by a semiconductor process and has a large relative dielectric constant. In this case, the dielectric of the auxiliary capacitor may be constituted of only the silicon nitride layer or have a multi-layer structure including an additional coating(s) such as a silicon oxide film.

In this case, larger capacitance can be obtained because the dielectric is made thinner and the silicon nitride film has a large dielectric constant. The thickness of the silicon nitride layer is set at 1,000 Å or less, preferably 500 Å or less.

Further, in this case, since the silicon nitride film covers the active matrix circuit from above the source line, barrier functions such as moisture resistance and ion resistance of the silicon nitride film can be utilized effectively.

Also, in the above configuration, it is effective to make the upper layer of the interlayer insulating film of organic resin (such as polyimide, polyamide, polyimideamide, epoxy, or acrylic) that can easily be planarized. However, since the organic resin is insufficient in barrier functions such as moisture resistance and ion resistance, it is desired that the lower insulating layer be made of a material having superior barrier functions such as silicon nitride, aluminum oxide, or aluminum nitride.

Further in the present invention, it is effective to form the metal interconnection in a region of the pixel where disclination (alignment disorder of liquid crystal molecules due to surface roughness or a lateral electric field) is apt to occur. This is because although disclination as caused by dust or the like can be eliminated by cleaning of a manufacturing process, there is no thorough measure against disclination as caused by roughness in the device structure (for example, roughness in the vicinity of a pixel electrode contact) or a lateral electric field.

It is inappropriate to use, as part of the pixel, a region where disclination is apt to occur, and conventionally such a region is covered with a light shield film so as not to serve as part of the pixel. In contrast, according to the invention, the auxiliary capacitor can be provided in such a region and hence the given area can be utilized efficiently.

BRIEF DESCRIPTION OF THE DRAWINGS

FIGS. 11A–11G are top views showing a manufacturing process of the structure shown in FIG. 9B;

DETAILED DESCRIPTION OF THE PREFERRED EMBODIMENTS

Embodiment 1

Figure 1:
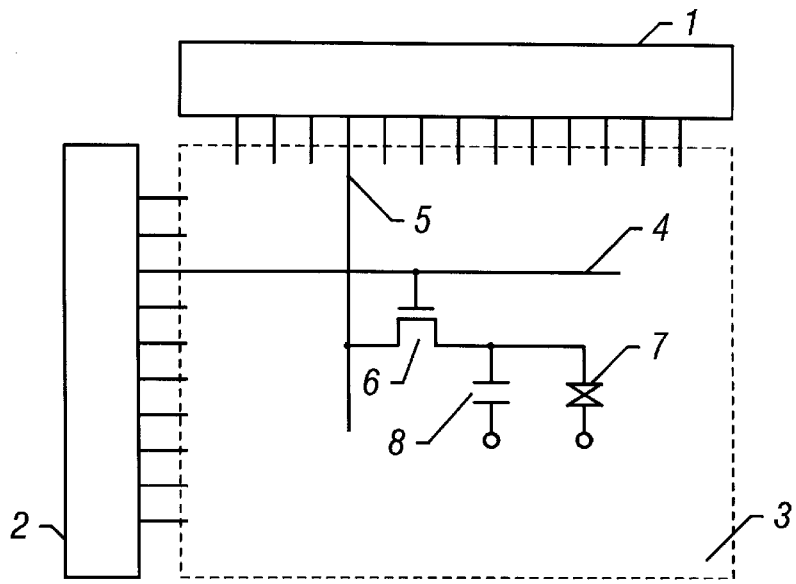
FIG. 1 is a circuit diagram of a conventional active matrix circuit.

FIGS. 2A–2B and 3A–3E are top views and sectional views, respectively, of a manufacturing process according to this embodiment. The reference numerals used in FIGS. 2A–2B correspond to those in FIGS. 3A–3E. Specific numerical values of the thickness and other parameters used in the following embodiments are just examples and are not necessarily optimum ones. Those who practices the invention may change those numerical values when necessary.

First, a 500-Å-thick amorphous silicon film is formed on a glass substrate 11 by plasma CVD or low-pressure thermal CVD. It is preferred that a 3,000-Å-thick silicon oxide film as an undercoat film be formed on the glass substrate 11 by sputtering or plasma CVD. But if a quartz glass substrate is employed, such an undercoat film may be omitted.

The amorphous silicon film is converted into a crystalline silicon film by a known annealing technique such as heating or laser light illumination and then etched into an active layer 12 of a thin-film transistor.

Figure 3A:
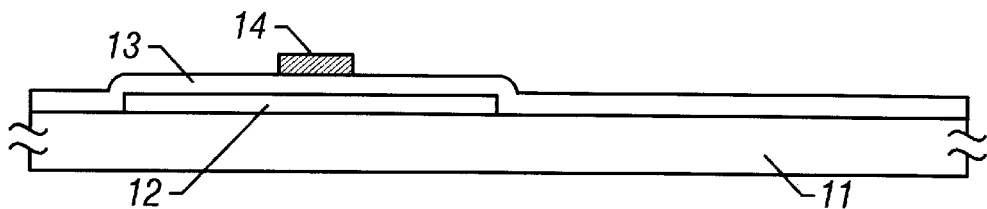
FIGS. 3A–3E are sectional views showing the manufacturing process of an active matrix circuit according to the first embodiment.
Figure 3B:
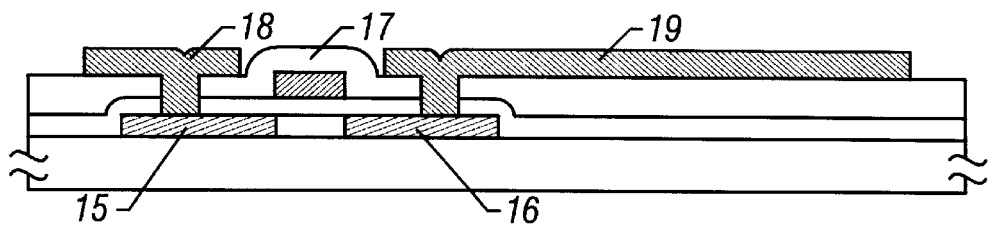

A 1,000-Å-thick silicon oxide film 13 as a gate insulating film is then formed by plasma CVD, low-pressure thermal CVD, or sputtering. Thereafter, a 5,000-Å-thick polysilicon film containing phosphorus is formed by low-pressure CVD and then etched to obtain a gate line (gate electrode) as shown in FIG. 3A.

Ions of phosphorus which is an impurity for imparting n-type conductivity are then implanted at a dose of $5\times10^{14}$ to $5\times10^{15}$ atoms/cm$^3$, to form an n-type source 15 and drain 16. After the impurity implantation, a heat treatment or illumination with laser light or strong light is performed to activate the impurity-ion-implanted regions.

Then, after a 5,000-Å-thick silicon oxide film as an interlayer insulating film 17 is formed by a known insulator layer forming technique, the interlayer insulating film 17 and the gate insulating film 13 are etched to form contact holes that reach the source 15 and the drain 16, respectively. A source line 18 and a metal interconnection 19 are then formed by a known metal wiring forming technique (see FIG. 3B).

Figure 2A:
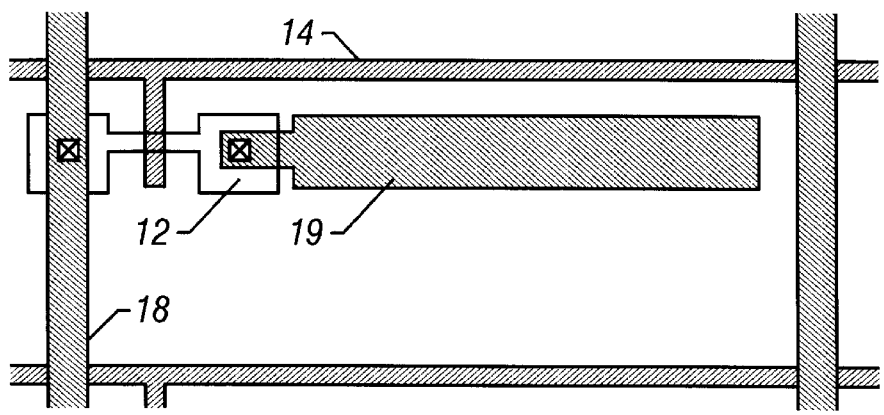
FIGS. 2A and 2B are top views showing a manufacturing process of an active matrix circuit according to a first embodiment of the present invention.

FIG. 2A is a top view showing a circuit obtained by the above steps.

A silicon nitride film 20 is then formed at a thickness of 250–1,000 Å (500 Å in this example) by plasma CVD by using silane and ammonia, silane and N$_2$O, or silane, ammonia, and N$_2$O. Alternatively, the silicon nitride film 20 may be formed by using dichlorosilane and ammonia. Further, low-pressure thermal CVD, photo CVD, or some other proper method may be used.

Subsequently, a polyimide layer 21 is formed by spin coating at a thickness of at least 8,000 Å, preferably 1.5 μm. The surface of the polyimide layer 21 is planarized. In this manner, an interlayer insulating film is formed that consists of the silicon nitride layer 20 and the polyimide layer 21. The polyimide layer 21 is then etched to form an opening 22 for an auxiliary capacitor (see FIG. 3C).

An etchant of the polyimide layer 21 may be of a type that is capable of etching silicon nitride too. Therefore, to protect the silicon nitride layer 20, a silicon oxide film of about 50–500 Å, for instance, 200 Å, in thickness may be formed between the silicon nitride layer 20 and the polyimide layer 21.

A 1,000-Å-thick titanium film is then formed by sputtering. Naturally, some other metal film such as a chromium film or an aluminum film may be used and some other film forming method may be used. By etching the titanium film, a black matrix 23 is formed so as to cover the previously formed opening 22 for an auxiliary capacitor (see FIG. 3D).

Figure 2B:
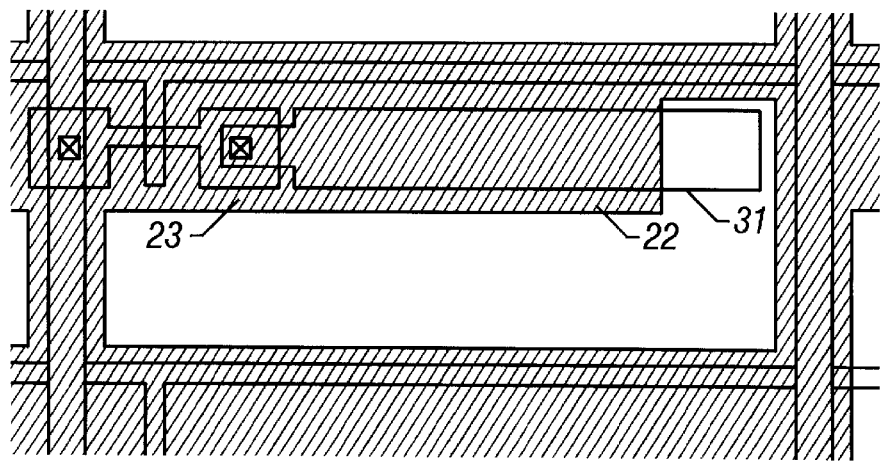

FIG. 2B is a top view showing the opening 22 for an auxiliary capacitor and the black matrix 23. An auxiliary capacitor is formed in a region where the opening 22 and the black matrix 23 coexist.

Then, after a 5,000-Å-thick polyimide film 24 as an interlayer insulating film is formed, the polyimide films 21 and 24 and the silicon nitride film 20 are etched to form a contact hole that reaches the metal interconnection 19. Thereafter, a 1,000-Å-thick ITO (indium tin oxide) is formed and then etched to form a pixel electrode 25 (see FIG. 3E).

An active matrix circuit is thus completed. As in the case of this embodiment, a polyimide insulting layer can easily be planarized and hence is very advantageous. In this embodiment, the auxiliary capacitor is obtained in the region corresponding to the opening 22 where the black matrix 23 and the metal interconnection 19 confront each other via the silicon nitride film 20 as a dielectric.

Embodiment 2

Figure 3C:
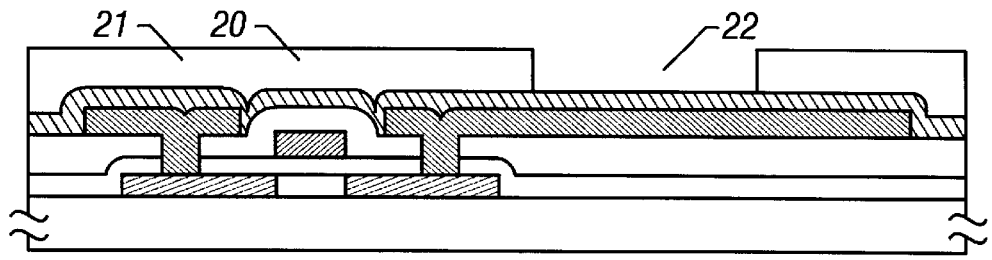
Figure 3D:
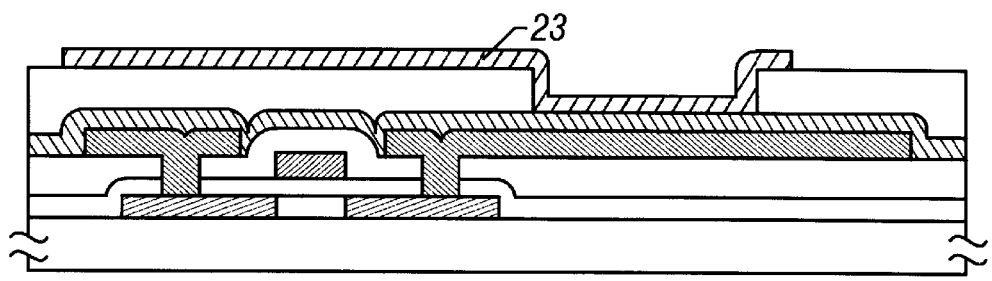
Figure 3E:
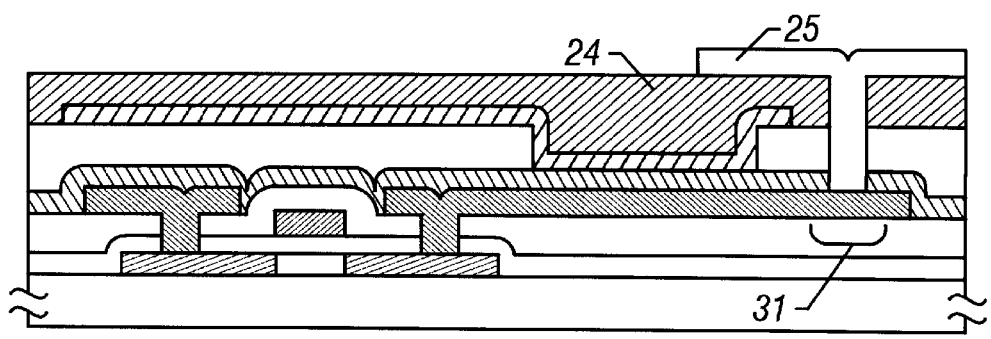
Figure 4A:
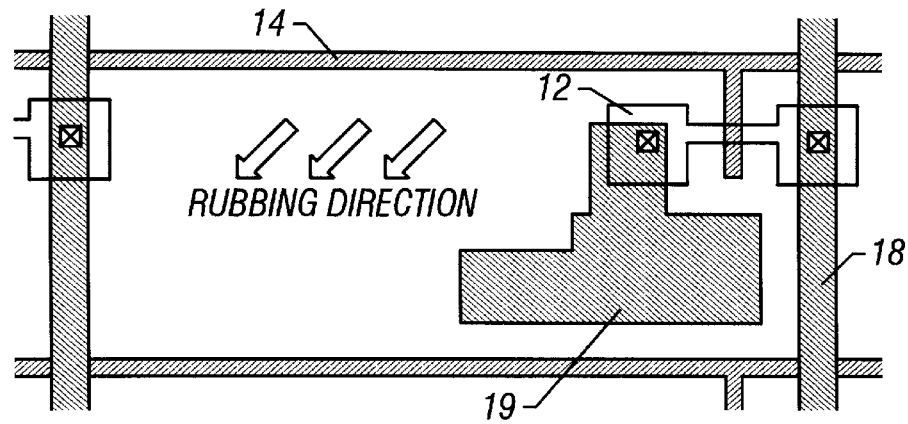
FIGS. 4A and 4B are top views showing a manufacturing process of an active matrix circuit according to a second embodiment of the invention.
Figure 4B:
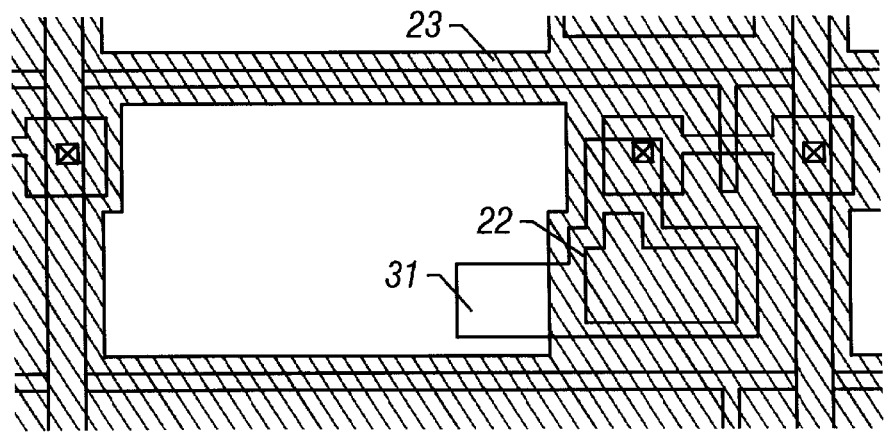

FIGS. 4A and 4B are top views showing a manufacturing process according to this embodiment, which is almost the same as that of the first embodiment. Reference numerals used in FIGS. 4A and 4B correspond to those in FIGS. 2A–2B and 3A–3E. This embodiment is different from the first embodiment in circuit layout. More specifically, this embodiment is directed to a method for effectively forming pixels (i.e., increasing the effective aperture ratio) by providing auxiliary capacitors in regions where disclination is apt to occur.

Figure 5:
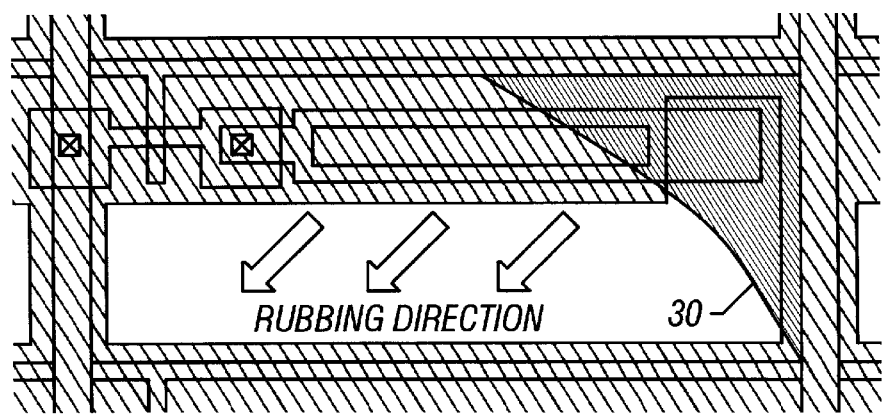
FIG. 5 illustrates occurrence of disclination.

First, how disclination occurs will be described with reference to FIG. 5. FIG. 5 shows the same circuit layout of a pixel as formed in the first embodiment. As shown in FIG. 5, in display device in which a pixel electrode contact 31 is provided at a top-right position of the pixel, rubbing is performed from top-right to bottom-left (different from rubbing from bottom-left to top-right), and source line inverted driving is performed (signals applied to adjacent source lines have opposite polarities; dot inverted driving is included), disclination is apt to occur in a top-right region 30 of the pixel. Since it is not appropriate to use the region 30 for display, it is desired that the region 30 be covered with the BM.

Figure 10A:
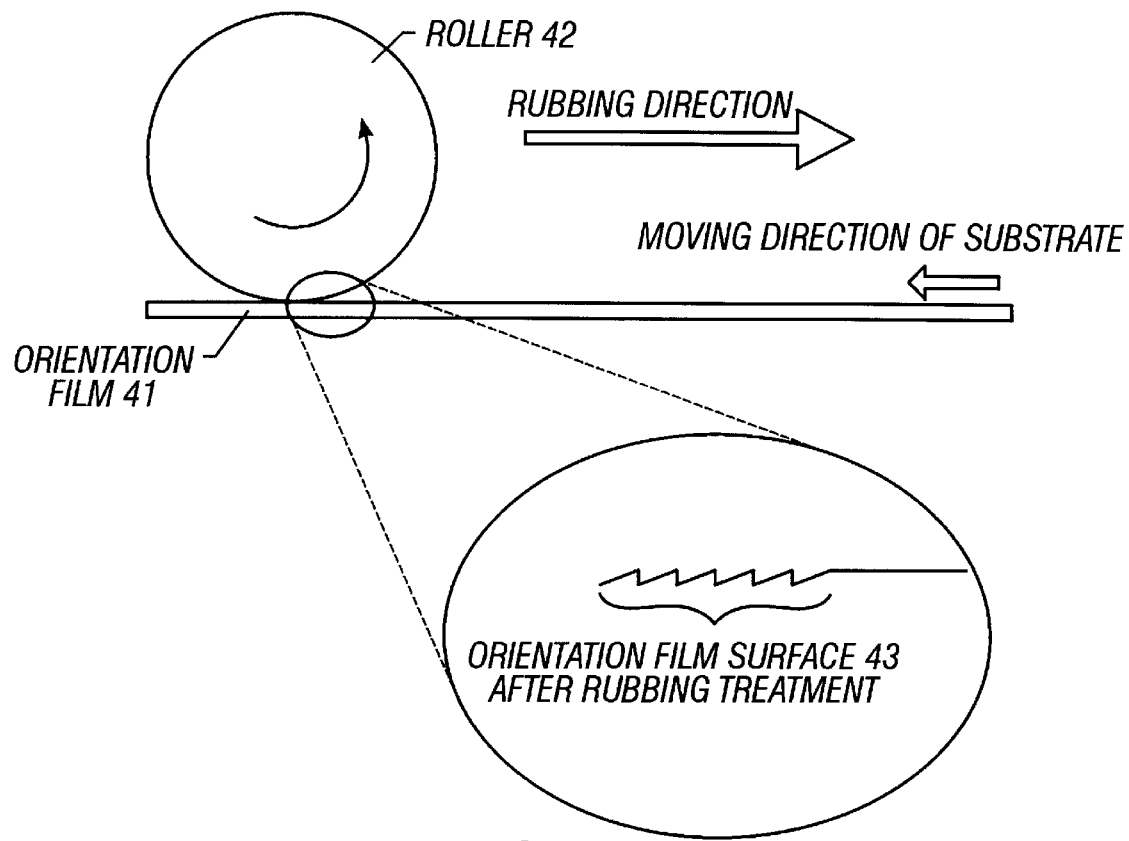
FIGS. 10A and 10B illustrate the definition of the term "rubbing direction"
Figure 10B:
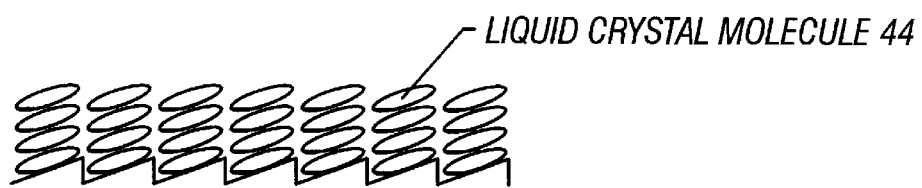

The definition of the term "rubbing direction" as used in this specification will be described with reference to FIGS. 10A and 10B. As shown in FIG. 10A, in a rubbing step, minute grooves are formed on an alignment film 41 by using a roller 42 having a buff cloth or the like on its circumferential surface. At this time, the substrate (or roller 42) is moved against the rotating roller 42.

As a result of the above process, very fine grooves shaped like teeth of a saw are formed on a surface 43 of the alignment film 41 (i.e., an alignment film surface after the rubbing treatment). Liquid crystal molecules align along those grooves, to exhibit regular alignment. FIG. 10B schematically shows how liquid crystal molecules align in the vicinity of the alignment film 41. Reference numeral 44 denotes liquid crystal molecules thus aligned.

The term "rubbing direction" as used in this specification means the rubbing direction shown in FIG. 10A that is identical to the movement direction of the roller 42 and opposite to the movement direction of the substrate. The rubbing direction can be recognized even after completion of an active matrix liquid crystal display based on an alignment state of liquid crystal molecules (pre-tilt angle, major axis direction, or the like). The alignment state of liquid crystal molecules, i.e., the rubbing direction, can also be recognized visually based on a viewing angle dependence or the like.

In the case of FIG. 5, rubbing has been performed on the pixel from top-right to bottom left, whereby disclination occurs in the region 30, i.e., mainly in a corner portion where the rubbing started in the pixel.

In view of the above, as shown in FIG. 4A, a metal interconnection 19 is formed on the right of the pixel rather than on the top side of the pixel (first embodiment).

Further, an opening 22 is formed above the metal interconnection 19 and a BM 23 is formed thereon. It is effective to form a pixel electrode contact 31 at a bottom-right position as shown in FIG. 4B.

As described above, the auxiliary capacitor is formed in the region where disclination is apt to occur. In this embodiment, the auxiliary capacitor that is formed on the top side of the pixel in the circuit of the first embodiment is moved to the position on the right of the pixel, and the aperture area in terms of circuit design remains the same. However, because the disclination region and the auxiliary capacitor (or BM) overlap with each other, the effective aperture area can be increased.

Embodiment 3

Figure 6A:
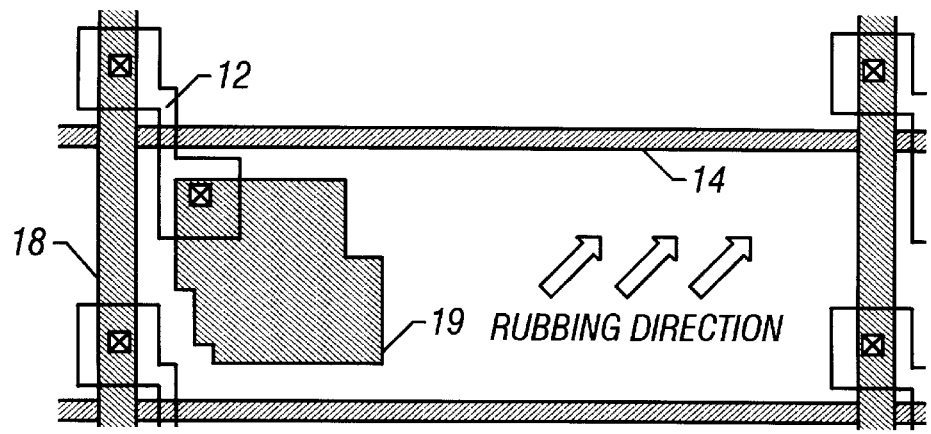
FIGS. 6A and 6B are top views showing a manufacturing process of an active matrix circuit according to a third embodiment of the invention.
Figure 6B:
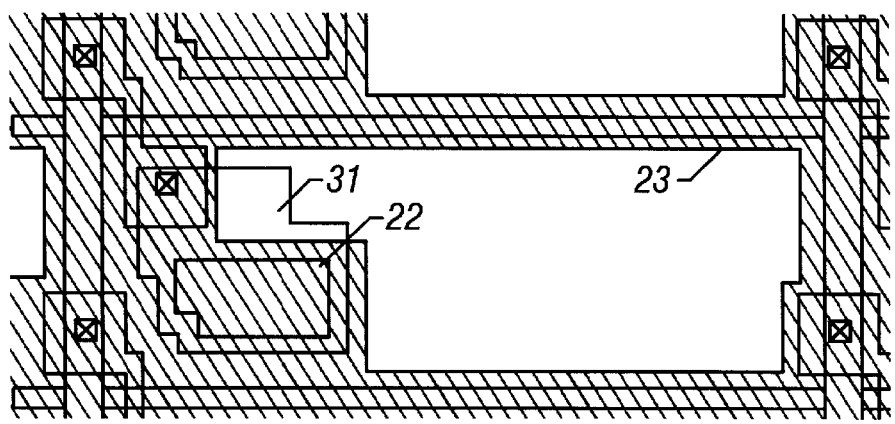

FIGS. 6A and 6B are top views showing a manufacturing process according to this embodiment, which is almost the same as that of the first embodiment. Reference numerals used in FIGS. 6A and 6B correspond to those in FIGS. 2A–2B and 3A–3E. In this embodiment, while the position of the auxiliary capacitor is substantially the same as in the second embodiment, more effective utilization of the given area is intended by changing the position of the active layer of the thin-film transistor.

In this embodiment, rubbing is performed from bottom-left to top-right, in which case disclination is apt to occur in a region on the bottom-left of the pixel. While in the second embodiment the auxiliary capacitor is formed in the region where disclination is apt to occur, in this embodiment part of the active layer of the thin-film transistor of the next row is formed in this region. That is, as shown in FIG. 6A, the metal interconnection 19 is located on the left of the pixel and the gate line 14 is so formed as to have a straight shape by eliminating its branch portion. The active layer is so formed as to cross the straight gate line 14.

Further, an opening 22 is formed above the metal interconnection 19 and a BM 23 is formed thereon (see FIG. 6B).

In the above manner, the auxiliary capacitor and part of the thin-film transistor are formed in the region where disclination is apt to occur. In this embodiment, the given area can be utilized more efficiently than in the circuit of the second embodiment by an area corresponding to the eliminated branch portion of the gate line 14.

Embodiment 4

Figure 7A:
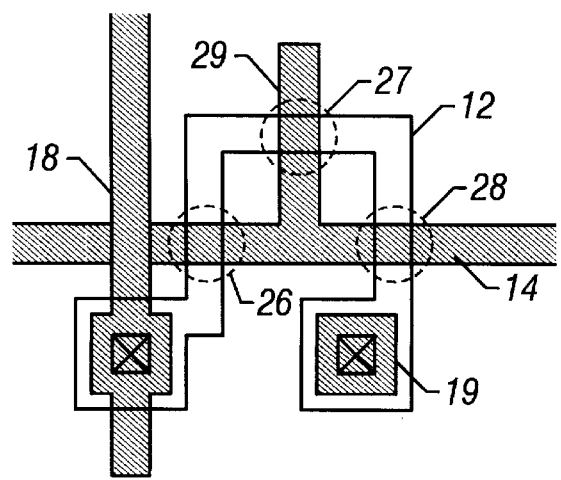
FIGS. 7A and 7B is a top view of the main part and a circuit diagram, respectively, of a thin-film transistor according to a fourth embodiment of the invention.
Figure 7B:
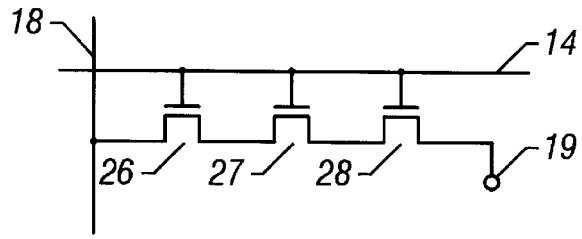
Figure 8A:
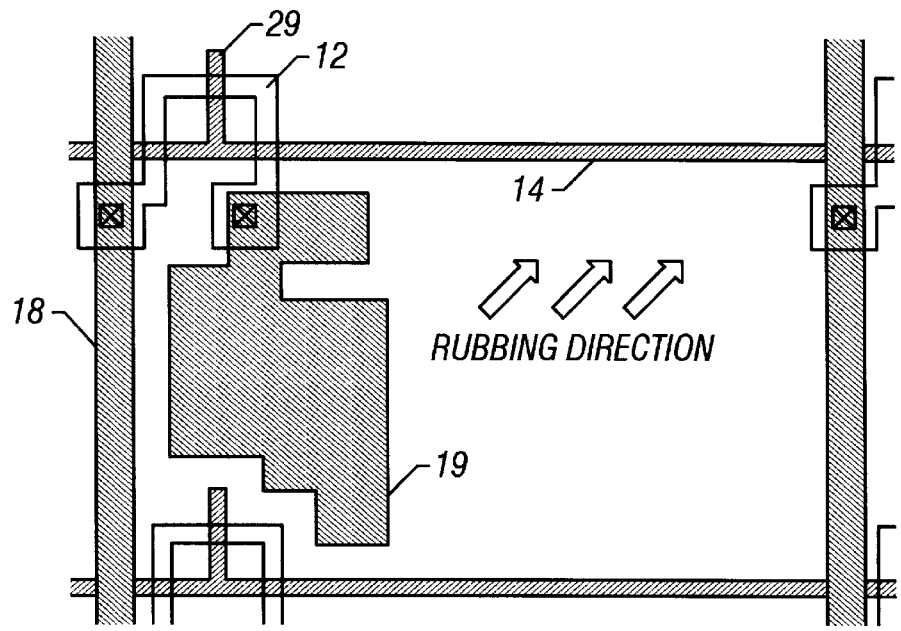
FIGS. 8A and 8B are top views showing a manufacturing process of an active matrix circuit according to the fourth embodiment.
Figure 8B:
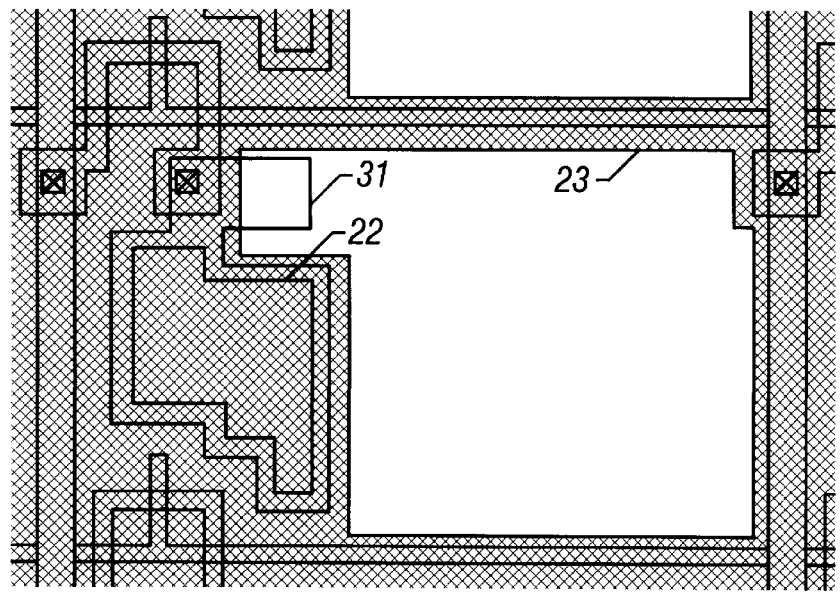

FIGS. 8A and 8B are top views showing a manufacturing process according to this embodiment, and FIGS. 7A and 7B are a top view of the main part and a circuit diagram, respectively, of a thin-film transistor according to this embodiment. The manufacturing process itself of this embodiment is almost the same as that of the first embodiment. Reference numerals used in FIGS. 7A–7B and 8A–8B correspond to those in FIGS. 2A–2B and 3A–3E. In this embodiment, while the position of the auxiliary capacitor is substantially the same as in the second embodiment, enhancement of the characteristics of the thin-film transistor and more effective utilization of the given area are intended by changing the positions of the active layer of the thin-film transistor and the gate electrode.

In this embodiment, rubbing is performed from bottom-left to top-right and hence disclination is apt to occur in a bottom-left region as in the case of the third embodiment. In the second embodiment the auxiliary capacitor is formed in such a region, and in the third embodiment the auxiliary capacitor and part of the active layer of the single-gate thin-film transistor. In contrast, in this embodiment part of the active layer of a triple-gate thin-film transistor as well as part of the gate electrode is formed in such a region.

First, the triple-gate thin-film transistor of this embodiment will be outlined with reference to FIGS. 7A and 7B. In this thin-film transistor, the gate line 14 is formed with a branch portion 29 and the active layer 12 is formed so as to overlap the gate line 14 and the branch portion 29 as shown in FIG. 7A. Transistors are formed at the respective crossed portions 26–28. That is, as shown in FIG. 7B, three thin-film transistors are formed in series between the source line 18 and the metal interconnection 19.

It is known that this type of multiple-gate transistor is particularly effective when used as a switching transistor of an active matrix (Japanese Examined Patent Publication No. Hei. 5-44195 discloses such transistors, the disclosure of which is incorporated by reference).

Although the thin-film transistor having the above structure occupies a bottom-left portion of the pixel of the next row, this does not cause a reduction in aperture ratio as in the case of the second and the third embodiments because disclination is apt to occur in this portion. That is, as shown in FIG. 8A, the gate line 14 is formed with the branch portion 29 and the active layer 12 is so formed as to cross the gate line 14 or the branch portion 29 three times. Further, the metal interconnection 19 is provided on the left of the pixel as shown in FIG. 8A.

Further, an opening 22 is formed above the metal interconnection 19 and a BM 23 is formed thereon (see FIG. 8B).

In the above manner, part of the auxiliary capacitor and part of the thin-film transistor are formed in the region where disclination is apt to occur. By the use of the multi-gate transistors, the auxiliary capacitor can be made much smaller. Therefore, this embodiment can provide characteristics that are superior to those of the third embodiment.

Embodiment 5

Figure 9A:
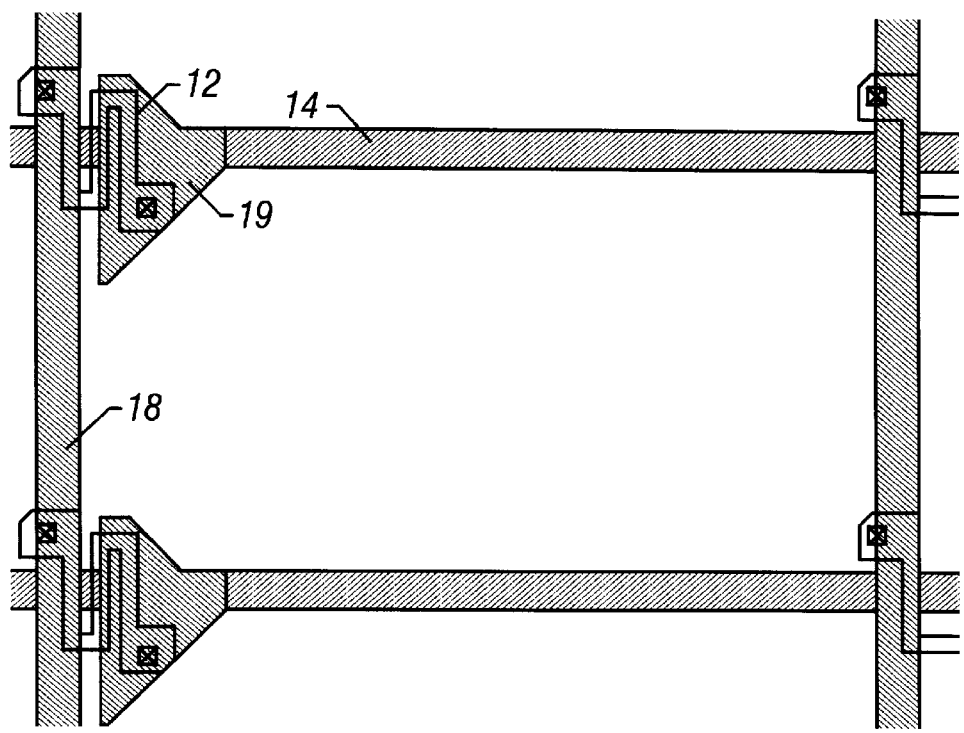
FIGS. 9A and 9B are top views showing the structure of an active matrix circuit according to a fifth embodiment of the invention.
Figure 9B:
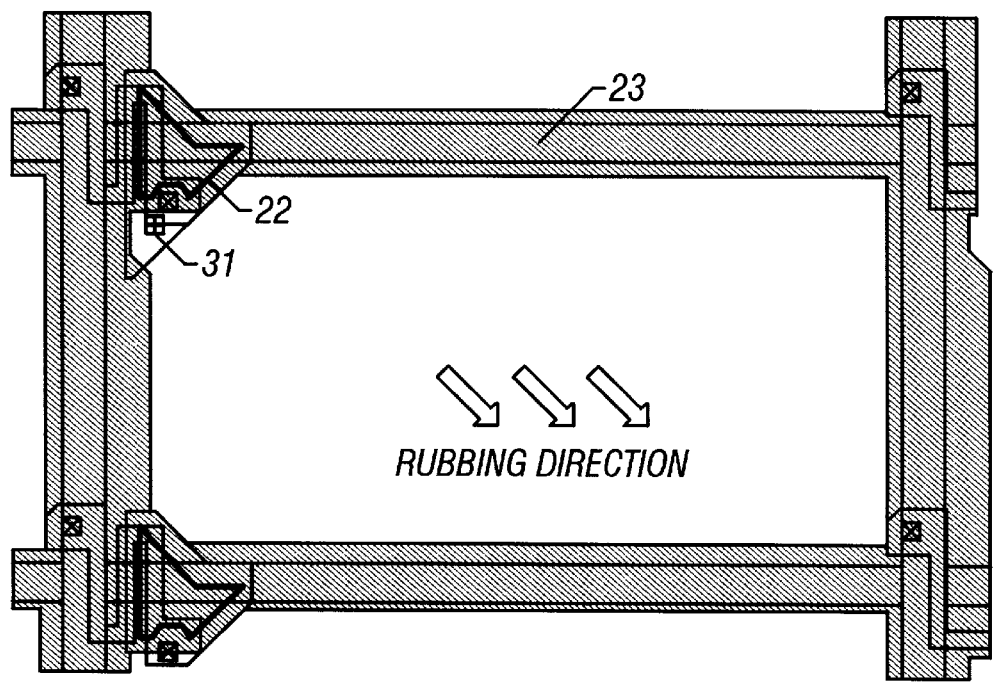

FIGS. 9A and 9B are top views showing a pixel structure according to this embodiment. The manufacturing process itself of this embodiment is almost the same as that of the first embodiment. Reference numerals used in FIGS. 9A and 9B correspond to those in FIGS. 2A–2B and 3A–3E. In this embodiment, more effective utilization of the pixel area is intended by changing the positions of the active layer of the thin-film transistor and the auxiliary capacitor.

In this embodiment, rubbing is performed from top-left to bottom-right and hence disclination is apt to occur in a top-left region (i.e., a corner portion where the rubbing is started in the pixel). In this embodiment, the active layer of the thin-film transistor and the auxiliary capacitor are superimposed one on another in forming those in such region.

First, this embodiment is different from the fourth embodiment in that instead of forming a branch portion (like the branch portion 28 shown in FIG. 8A) so as to extend from a gate line 14, the gate line 14 itself is used as gate electrodes by forming the active layer a zigzag pattern. The area occupied by the thin-film transistor in the pixel can be reduced by employing the active layer having such a pattern.

Further, by superimposing the active layer 12 of the thin-film transistor and the auxiliary capacitor 22 one on another, the area necessary for the light shield film 23 in the left end portion of the pixel can be minimized. That is, all the parts that should be shielded from light for reasons other than disclination are concentrated in the top-left portion. In the remaining area, the light shield film 23 may be formed so as to cover the region where disclination tends to occur. The area necessary for the light shield film 23 is thus greatly reduced.

Further, by forming the switching element and the auxiliary capacitor in the region where disclination is apt to occur due to the rubbing direction, such a region is fixed at a particular position in the pixel. In this case, the pixel electrode contact 31 greatly contributes to the fixing of such a region.

The above structure is enabled by reducing an off-current-induced variation in the voltage that is applied to the liquid crystal by employing a multi-gate thin-film transistor and thereby reducing the necessary auxiliary capacitance.

A manufacturing process of the structure shown in FIG. 9B will now be described with reference to FIGS. 11A–11G.

Figure 11A:
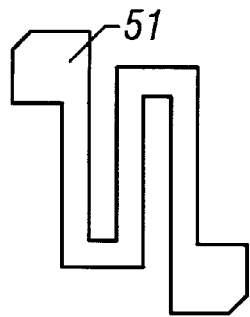

First, an active layer 51 is formed on a substrate (not shown) having an insulating surface (see FIG. 11A). The active layer 51 may be constituted of a crystalline semiconductor film (typically a crystalline silicon film) having a thickness of 20–100 nm (preferably 25–70 nm).

Although the crystalline silicon film may be formed by any known means, in this embodiment it is formed by the technique disclosed in Japanese Patent Application Laid-open No. Hei 8-78329, the disclosure of which is incorporated by reference.

Further, in this embodiment, after the crystalline silicon film is obtained by the technique of the above publication, the concentration of the catalyst element that was utilized in the crystallization step is reduced by a gettering means using phosphorus (Japanese Patent Application No. Hei 9-65406 filed on Mar. 3, 1997 discloses this method). Similar methods are disclosed in a pending U.S. Patent application based on Japanese Patent Application Nos. 8-344,574 and 9-287715, the disclosure of which is incorporated by reference. Alternatively, the concentration of the catalyst element can be reduced by performing a heat treatment in an atmosphere containing a halogen element. A pending U.S. Patent application based on Japanese Patent Application No. 8-301249 discloses such a method and the disclosure thereof is incorporated by reference.

The active layer 51 is obtained by patterning the thus-formed crystalline silicon film. After a gate insulating film (not shown) is formed by plasma CVD, the characteristics of the interface between the active layer 51 and the gate insulating film are improved by executing a thermal oxidation step. Related conditions are so set that the final thickness of the active layer (after the thermal oxidation step) becomes 10–75 nm (preferably 15–45 nm).

Figure 11B:
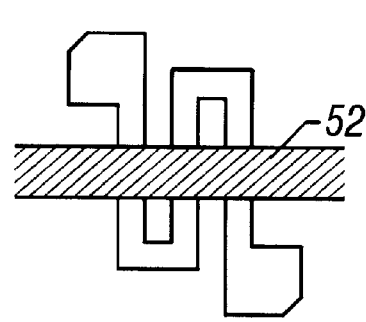
Figure 11B:
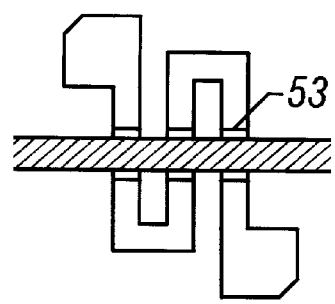
Figure 11D:
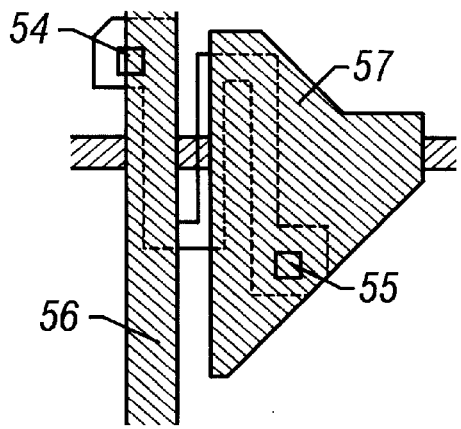

Thereafter, a film made of aluminum or a material having aluminum as the main component (and containing scandium at 2 wt % in this embodiment) is formed and then patterned into a gate line 52 (see FIG. 11B).

Source and drain regions, a channel forming region, and low-concentration impurity regions are then formed by using the technique disclosed in Japanese Patent Laid-Open No. 7-135318 or U.S. Pat. No. 5,648,277, the disclosure of which is incorporated by reference. In this embodiment, as shown in FIG. 11C, low-concentration impurity regions (LDD regions) 53 are formed between the channel forming region and the source and drain regions at a length of 0.5–1.5 µm (typically 0.7–1 µm).

Subsequently, the impurity element (group 13 or 15) added to the active layer 51 is activated by thermal annealing, and a first interlayer insulating film (not shown) is formed so as to cover the gate line 52. Then, after contact holes 54 and 55 are formed through the first interlayer insulating film, a source line 56 and a metal interconnection 57 are formed (see FIG. 11D).

In this embodiment, the source line 56 and the metal interconnection 57 have a titanium/aluminum/titanium three-layer laminate structure of 150/500/1100 nm in thickness.

The above manufacturing step completes formation of a switching element (TFT) for applying a liquid crystal control voltage to a pixel electrode.

Then, a second interlayer insulating film (not shown) is formed so as to cover the source line 56 and the metal interconnection 57, and a recess 58 is formed where an auxiliary electrode will be formed later. The second interlayer insulating film may be of either a single layer or a laminate structure of two or more layers.

Figure 11E:
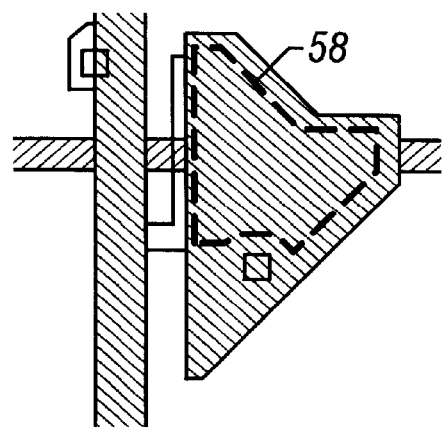

In this embodiment, the second interlayer insulating film is formed so as to have a laminate structure consisting of a silicon nitride film (50 nm), a silicon oxide film (20 nm), and an acrylic film (1 µum) from the bottom (see FIG. 11E). Instead of acrylic, some other organic resin material such as polyimide may be used.

The recess 58 is formed in the acrylic film by dry etching with the silicon oxide film serving as an etching stopper. Therefore, a laminate film consisting of the silicon nitride film and the silicon oxide film remains at the bottom of the recess 58. In this embodiment, this laminate film is used as a dielectric of the auxiliary capacitor. Naturally it is possible to leave only the silicon nitride film by selectively removing the silicon oxide film by wet etching.

Although this embodiment employs the laminate structure consisting of the silicon nitride film, the silicon oxide film, and the organic resin film, it goes without saying that the invention is not limited to this structure. The invention can be practiced more effectively by forming, as a bottom layer, a thin insulating film having as large a relative dielectric constant as possible and forming thereon a thick insulating film having a small relative dielectric constant. That is, it is necessary that the second interlayer insulating film have such a structure as to effectively serve as a dielectric of the auxiliary capacitor in the recess 58 and also effectively serve as an interlayer insulating film in the other area.

Where the second interlayer insulating film is a single layer, it may have a structure in which a recess is formed by half etching and the thinned portion is used as a dielectric of the auxiliary capacitor.

After the recess 58 has been formed in the second interlayer insulating film in the above manner, a black mask 59 is formed. Although the black mask 59 is made of titanium in this embodiment, it may be a metal film made of chromium, tantalum, or the like.

Figure 11F:
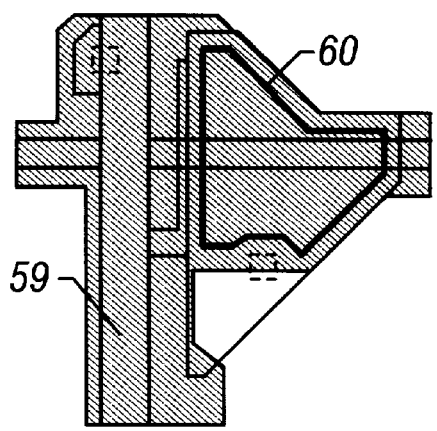
Figure 11G:
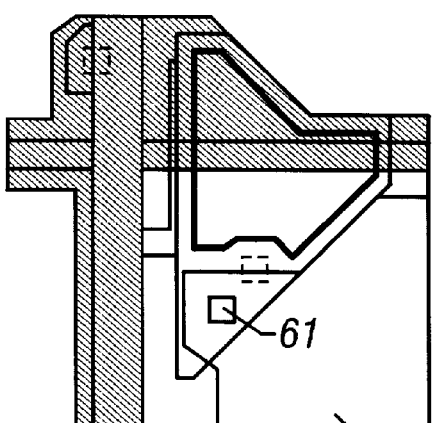

In this state, an auxiliary capacitor 60 is thus obtained in which the black mask 59 and the metal interconnection 57 are top and bottom electrodes, respectively, and the second interlayer insulating film (more correctly, the laminate film of the silicon nitride film and the silicon oxide film) is a dielectric (see FIG. 11F).

Thereafter, a 1-µm-thick acrylic film as a third interlayer insulating film (not shown) is formed on the black mask 59. Naturally it may be some other type of organic resin film. Then, after a contact hole 61 is formed, a transparent conductive film (typically an ITO film) is formed as a pixel electrode 62 (see FIG. 11G).

After the pixel structure has been completed in the above manner, hydrogenation is performed to hydrogen-terminate dangling bonds that remain in the active layer of the thin-film transistor. A plurality of pixels are formed by the above manufacturing process and a pixel matrix circuit is thereby completed. At least one thin-film transistor and an auxiliary capacitor may be provided in each pixel of the pixel matrix circuit.

It is possible to form, on the same substrate, not only the pixel matrix circuit but also driver circuits and signal processing circuits (logic circuits such as a γ correction circuit and a D/A converter). A manufacturing process of these circuits is basically the same as that of this embodiment (actually the former is completed at the step of FIG. 11D), and hence a detailed description therefor is omitted.

Since the invention relates to the layout and structure of the pixel, the other circuits (above-mentioned driver, circuits and logic circuits) to be formed on the same substrate may be configured in any ways. The manufacturing process and the structure of those circuits may be determined properly by a party who practices the invention.

Although this embodiment is directed to the transmission type liquid crystal display device that uses a transparent conductive film as the pixel electrode, a reflection type liquid crystal display device can easily be manufactured by using a reflective electrode as the pixel electrode.

Although this embodiment is directed to the case of forming a thin-film transistor as the switching element in the pixel, a MIM device or the like may be formed instead of it.

Embodiment 6

Although in the fifth embodiment the gate line is made of aluminum or a material having aluminum as the main component, other conductive films may be used such as a crystalline silicon film exhibiting one conductivity type, a tantalum film, a tungsten film, a molybdenum film, and a chromium film.

The low-concentration impurity regions may be formed by known methods such as a method utilizing anodization or utilizing sidewall technique.

Although in the first embodiment the gate line 14 is a polysilicon film containing phosphorus, in the first embodiment it may be made of aluminum or a material having aluminum as the main component or it may be one of "other conductive films" as mentioned above.

Embodiment 7

Figure 12A:
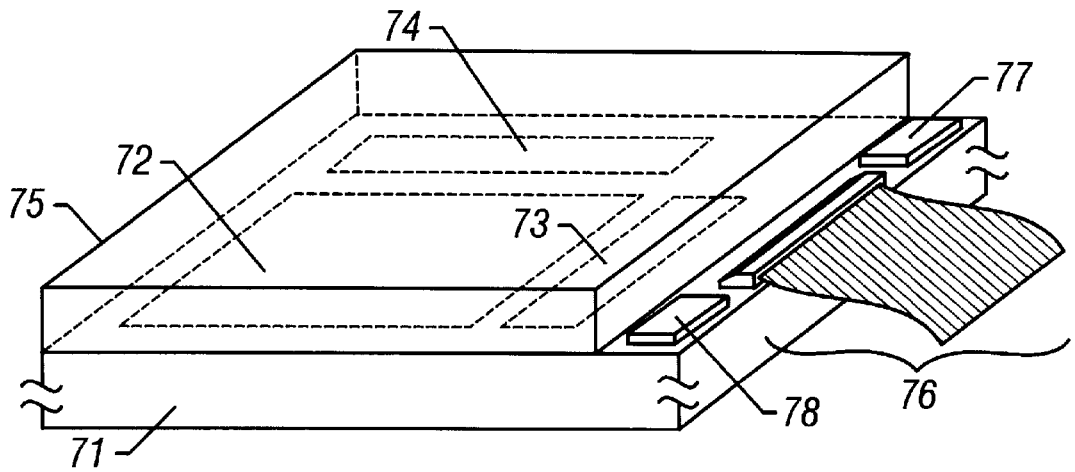
FIGS. 12A and 12B show appearances of active matrix liquid crystal display devices according to a seventh embodiment of the invention.
Figure 12B:
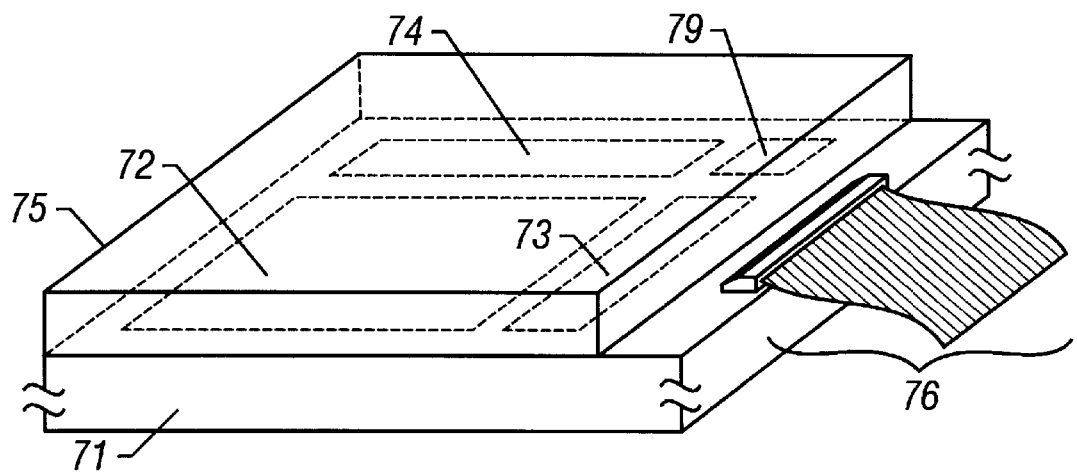
Figure 1:
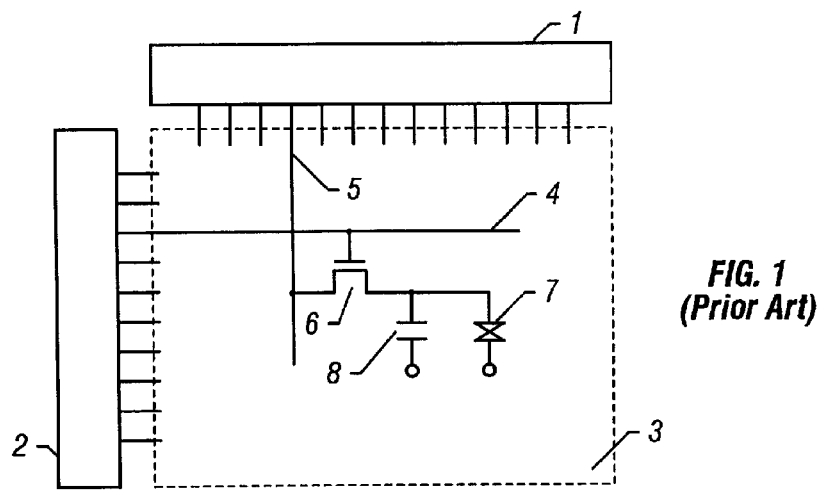
Figure 2A:
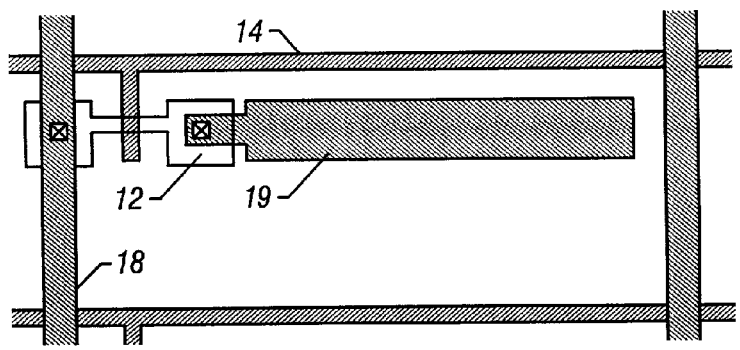
Figure 2B:
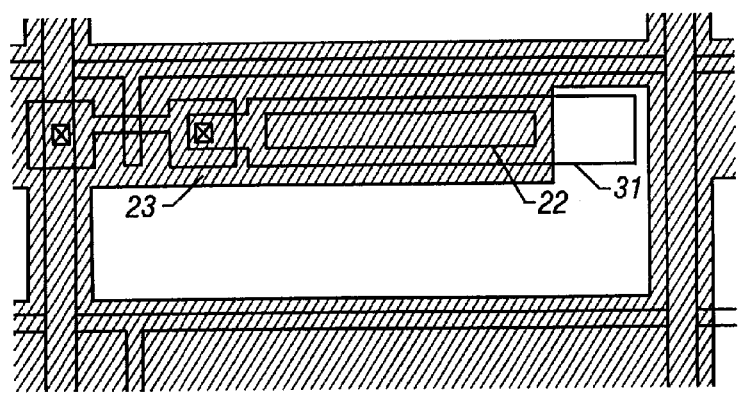
Figure 3A:
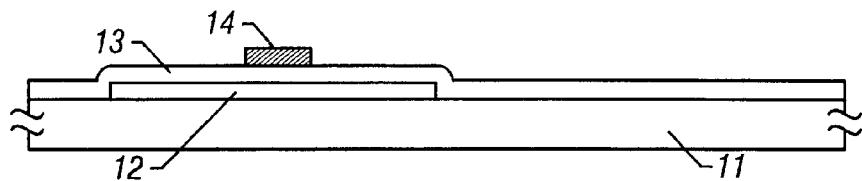
Figure 3B:
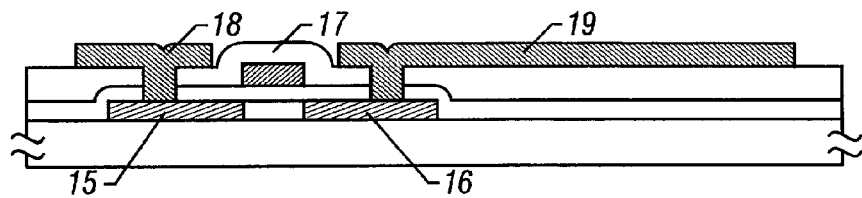
Figure 3C:
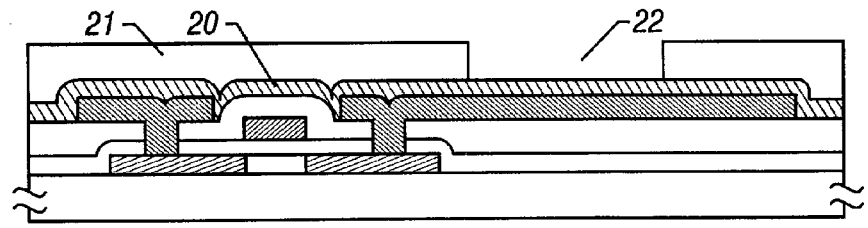
Figure 3D:
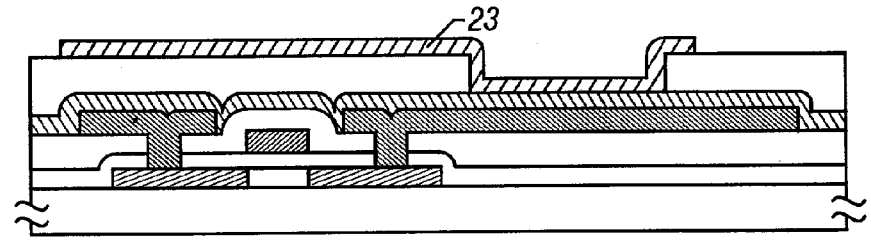
Figure 3E:
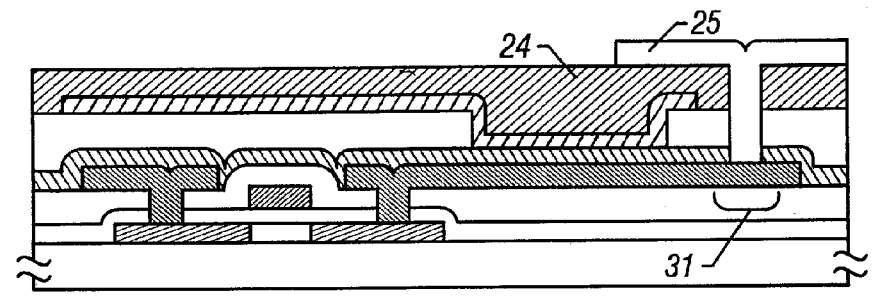

This embodiment is directed to a case where an active matrix liquid crystal display device is formed by using any of the active matrix substrates (device formation side substrates) having the structures according to the first to sixth embodiments. FIGS. 12A and 12B show appearances of active matrix liquid crystal display devices according to this embodiment.

As shown in FIG. 12A, a pixel matrix circuit 72, a source-side driver circuit 73, and a gate-side driver circuit 74 are formed on an active matrix substrate 71. It is preferred that the driver circuits 73 and 74 be formed by using a CMOS circuit in which an n-type TFT and a p-type TFT are combined complementarily. Reference numeral 75 denotes an opposed substrate.

In the active matrix liquid crystal display device of FIG. 12A, the active matrix substrate 71 and the opposed substrate 75 are bonded to each other in such a manner that their end faces are flush with each other except for one portion, where the opposed substrate 75 is removed and a FPC (flexible print circuit) 76 is connected to an exposed part of the active matrix substrate 71. The FPC 76 transmits external signals to the inside circuits.

IC chips 77 and 78 are mounted on the surface to which the FPC 76 is connected. In the IC chips 77 and 78, various circuits such as a timing pulse generation circuit, a γ correction circuit, a memory circuit, and an operation circuit are formed on a silicon substrate. Although two IC chips are mounted in FIG. 12A, only one IC or three or more ICs may be provided.

FIG. 12B shows another configuration. The parts in FIG. 12B that are the same as those in FIG. 12A are given the same reference numerals. In this configuration, the signal processing that is performed by the IC chips 77 and 78 in the configuration of FIG. 12A is performed by a logic circuit 79 that is formed on the same circuit by using thin-film transistors. In this case, the logic circuit 79 is basically composed of CMOS circuits as in the case of the driver circuits 73 and 74.

In the active matrix liquid crystal display devices of this embodiment, the black mask is provided on the active matrix substrate (BM on TFT). It is possible to provide another black mask on the opposed substrate.

The active matrix liquid crystal display devices may be configured so as to perform color display by using color filters or without using color filters, i.e., by driving the liquid crystal in an ECB (electric-field-controlled birefringence) mode, a GH (guest-host) mode, or the like.

Further, a microlens array may be used as in the technique disclosed in Japanese Patent Application Laid-open No. Hei 8-15686.

Embodiment 8

The active matrix liquid crystal display devices of the seventh embodiments are used as a display in various kinds of electronic apparatuses. Electronic apparatuses that will be described in this embodiment are defined as products mounted with an active matrix liquid crystal display device.

Examples of those electronic apparatuses are a video camera, a still camera, a projector, a projection TV, a head-mounted display, a car navigation apparatus, a personal computer (including a notebook-sized one), and a portable information terminal (a mobile computer, a cellular telephone, etc.). FIGS. 13A–13F show part of those examples.

Figure 13A:
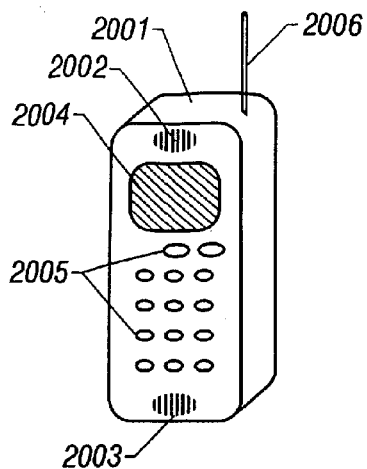
FIGS. 13A–13F show electronic apparatuses mounted with an active matrix liquid crystal display device according an eighth embodiment of the invention.

FIG. 13A shows a portable telephone, which consists of a main body 2001, a voice output section 2002, a voice input section 2003, a display device 2004, manipulation switches 2005, and an antenna 2006. The invention can be applied to the display device 2004 etc.

Figure 13B:
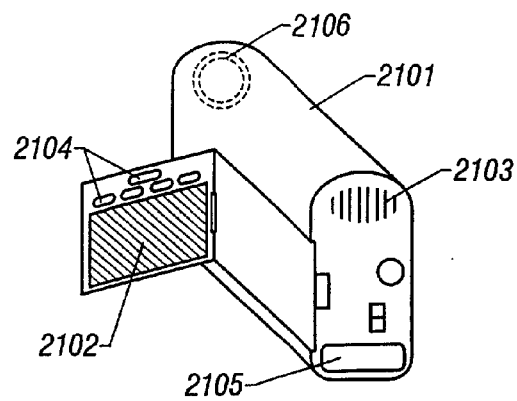

FIG. 13B shows a video camera, which consists of a main body 2101, a display device 2102, a sound input section 2103, manipulation switches 2104, a battery 2105, and an image receiving section 2106. The invention can be applied to the display device 2102.

Figure 13C:
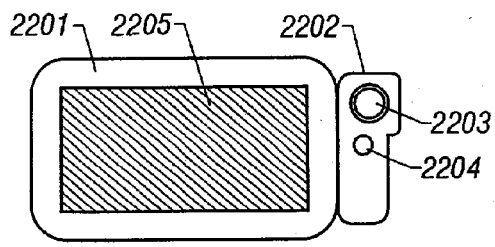

FIG. 13C shows a mobile computer, which consists of a main body 2201, a camera section 2202, an image receiving section 2203, a manipulation switch 2204, and a display device 2205. The invention can be applied to the display device 2205 etc.

Figure 13D:
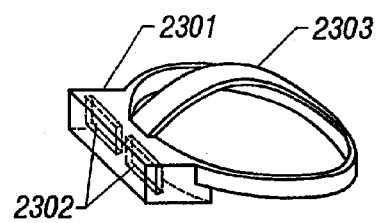

FIG. 13D shows a head-mounted display, which consists of a main body 2301, a display device 2302, and a band section 2303. The invention can be applied to the display device 2302.

Figure 13E:
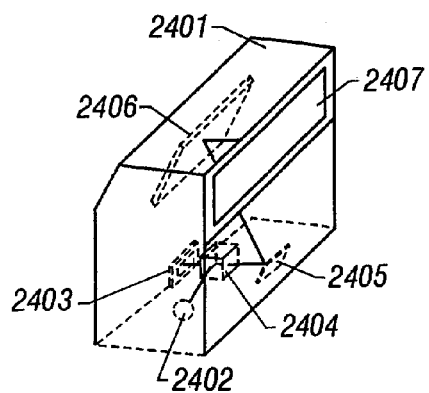

FIG. 13E shows a rear projector, which consists of a main body 2401, a light source 2402, a display device 2403, a polarizing beam splitter 2404, reflectors 2405 and 2406, and a screen 2407. The invention can be applied to the display device 2403.

Figure 13F:
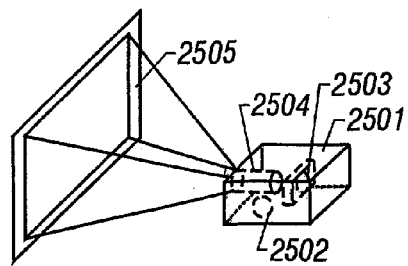

FIG. 13F shows a front projector, which consists of a main body 2501, a light source 2502, a display device 2503, an optical system 2504, and a screen 2505. The invention can be applied to the display device 2503.

As described above, the application range of the invention is very wide and the invention can be applied to electronic apparatuses of any fields. The invention can also be applied to an electric scoreboard, an advertisement display, and the like.

The methods for forming the auxiliary capacitor between the conductive coating (electrode) serving as the black matrix and the metal interconnection that is located in the same layer as the source line have been described above. Although the embodiments are directed to the case of using the top-gate thin-film transistor, it is apparent that the invention can also be applied in a similar manner to the case of using the bottom-gate thin-film transistor because the invention relates to the improvement in the structure above the source line. As exemplified by this fact, the invention is very useful from the industrial point of view.

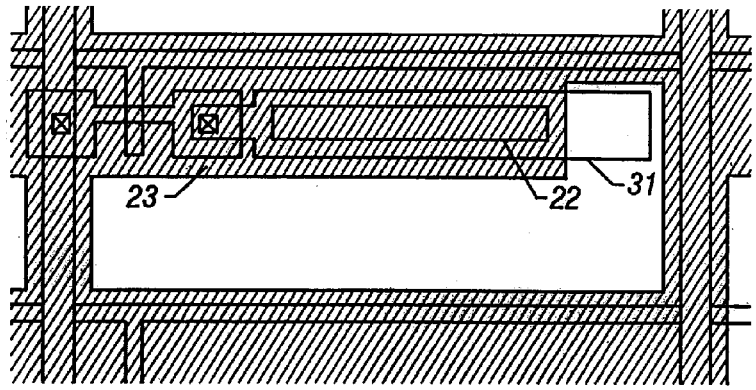

What is claimed is:

1. An active matrix device comprising:
   a gate line formed over a substrate;
   a source line formed over said gate line;
   a switching element including a thin film transistor formed at an intersection between said gate line and said source line wherein said source line is electrically connected to a source of said switching element;
   a metal interconnection electrically connected to a drain of said switching element wherein said metal interconnection is positioned in a same layer as said source line;
   an interlayer insulating film comprising lower and upper insulating layers formed over said source line, said metal interconnection and said switching element, wherein said upper insulating layer has an opening to expose said lower insulating layer in said opening;
   a light blocking conductive film formed on said interlayer insulating film, further comprising a capacitor formed at said opening between said light blocking conductive film and said metal interconnection with said lower insulating layer interposed therebetween; and
   a pixel electrode electrically connected to said metal interconnection and located over said light blocking conductive film,
   wherein said switching element and said capacitor are provided in a region of a pixel where disclination is likely to occur.

2. A device according to claim 1 wherein said light blocking conductive film is kept at a constant voltage.

3. A device according to claim 1 wherein said lower insulating layer comprises a different material from said upper insulating layer.

4. A device according to claim 1 wherein said lower insulating layer comprises silicon nitride.

5. A device according to claim 1 wherein said upper insulating layer comprises an organic resin.

6. A device according to claim 4 wherein a thickness of said lower insulating layer is not larger than 1000 Å.

7. A device according to claim 1 wherein said light blocking conductive film is in direct contact with said lower insulating layer in said opening.

8. A device according to claim 1 wherein said metal interconnection is provided in said region.

9. A device according to claim 1 wherein said capacitor is overlapped with said switching element.

10. An active matrix device comprising:
a gate line formed over a substrate;
a source line formed over said gate line;
a switching element including a thin film transistor formed at an intersection between said gate line and said source line wherein said source line is electrically connected to a source of said switching element;
a metal interconnection electrically connected to a drain of said switching element;
an interlayer insulating film formed over said source line, said metal interconnection and said switching element;
a light blocking conductive film formed on said interlayer insulating film;
a capacitor formed between said metal interconnection and said light blocking conductive film with said interlayer insulating film interposed therebetween,
a pixel electrode electrically connected to said metal interconnection and located over said light blocking conductive film,
wherein said capacitor covers at least an active region of said switching element, said capacitor and said switching element provided below a region where disclination is likely to occur.

11. A device according to claim 10 wherein said interlayer insulating film comprises a silicon nitride layer and an organic resin layer formed thereon, said organic resin layer having an opening to expose said silicon nitride layer therein where said capacitor is formed.

12. A device according to claim 11 wherein said interlayer insulating film further includes a silicon oxide film between said silicon nitride layer and said organic resin layer.

13. An active matrix device comprising:
a plurality of gate lines extending in parallel and formed over a substrate;
a plurality of source lines extending orthogonally to said plurality of gate lines and formed over the substrate;
a plurality of pixels surrounded by said plurality of gate lines and said plurality of source lines;
at least one thin film transistor formed in each of said plurality of pixels, wherein a gate of said thin film transistor is connected to one of said plurality of gate lines and a source of said thin film transistor is connected to one of said plurality of source lines;
a pixel electrode formed over said thin film transistor in each of said plurality of pixels wherein said pixel electrode is electrically connected to the associated thin film transistor;
an orientation film formed on said pixel electrode wherein a surface of the orientation film has been rubbed in one direction from one corner of the pixel; and
an auxiliary capacitor electrically connected to the thin film transistor in parallel with the pixel electrode wherein said auxiliary capacitor has a light shielding property and covers an active region of the thin film transistor,
wherein said auxiliary capacitor is positioned so as to cover a part of said pixel including said one corner thereof.

14. A device according to claim 13 wherein said thin film transistor is a top-gate type.

15. A device according to claim 13 wherein said thin film transistor is a bottom-gate type.

16. An active matrix device comprising:
a plurality of gate lines extending in parallel and formed over a substrate;
a plurality of source lines extending orthogonally to said plurality of gate lines and formed over the substrate;
a plurality of pixels surrounded by said plurality of gate lines and said plurality of source lines;
at least one thin film transistor formed in each of said plurality of pixels;
a pixel electrode formed over said thin film transistor in each of said plurality of pixels wherein said pixel electrode is electrically connected to the associated thin film transistor through a metal interconnect;
an orientation film formed on said pixel electrode wherein a surface of the orientation film has been rubbed in one direction from one corner of the pixel;
a black matrix formed above said thin film transistor and below said pixel electrode, said black matrix comprising a light shielding conductive film; and
an auxiliary capacitor formed between said black matrix and said metal interconnect in each of said pixels,
wherein said auxiliary capacitor is positioned so as to cover a part of said pixel including said one corner thereof.

17. A device according to claim 16 wherein said thin film transistor is a top-gate type.

18. A device according to claim 16 wherein said thin film transistor is a bottom-gate type.

19. A device according to claim 16 wherein said thin film transistor is a multi-gate type.

20. A device according to claim 16 wherein each of said pixels has a rectangular shape.

21. A device according to claim 16 wherein said auxiliary capacitor has an insulating film interposed between said black matrix and said metal interconnect.

* * * * *

UNITED STATES PATENT AND TRADEMARK OFFICE
CERTIFICATE OF CORRECTION

PATENT NO.    : 6,088,070
DATED         : July 11, 2000
INVENTOR(S)   : Hisashi Ohtani et al.

It is certified that error appears in the above-identified patent and that said Letters Patent is hereby corrected as shown below:

The title page should be deleted and substitute therefore the attached title page.

<u>Drawings,</u>
Drawing sheet 1 of 10 consisting of Fig. 2B should be deleted and substitute as shown on the attached page.

Drawing sheet 2 of 10 consisting of Fig. 3C should be deleted and substitute as shown on the attached page.

Drawing sheet 10 of 10 consisting of Fig. 12C should be deleted and substitute as Fig. 13F as shown on the attached page.

Signed and Sealed this

Sixth Day of May, 2003

JAMES E. ROGAN
*Director of the United States Patent and Trademark Office*

United States Patent [19]

Ohtani et al.

[11] Patent Number: 6,088,070
[45] Date of Patent: Jul. 11, 2000

[54] ACTIVE MATRIX LIQUID CRYSTAL WITH CAPACITOR BETWEEN LIGHT BLOCKING FILM AND PIXEL CONNECTING ELECTRODE

[75] Inventors: Hisashi Ohtani; Yasushi Ogata; Yoshiharu Hirakata, all of Kanagawa, Japan

[73] Assignee: Semiconductor Energy Laboratory Co., Ltd., Kanagawa-ken, Japan

[21] Appl. No.: 09/008,412

[22] Filed: Jan. 16, 1998

[30] Foreign Application Priority Data

Jan. 17, 1997 [JP] Japan ................................ 9-019825
Oct. 31, 1997 [JP] Japan ................................ 9-316567

[51] Int. Cl.$^7$ ................................ G02F 1/1343
[52] U.S. Cl. ................ 349/38; 349/44; 349/111
[58] Field of Search ................ 349/38, 39, 44, 349/110, 111, 139

[56] References Cited

U.S. PATENT DOCUMENTS 5,159,477  10/1992  Shimada et al. ................ 349/39
5,708,485  1/1998   Sato et al. ...................... 349/42
5,745,195  4/1998   Zhang ............................ 349/39
5,777,701  7/1998   Zhang ............................ 349/44
5,818,552  10/1998  Sato .............................. 349/43
5,899,548  5/1999   Ishiguru ........................ 349/47

*Primary Examiner*—Kenneth Parker
*Attorney, Agent, or Firm*—Fish & Richardson P.C.

[57] ABSTRACT

An conductive coating serves as a light shield film and is kept at a give voltage. A metal interconnection is located in the same layer as a source line and connected to the drain of a thin-film transistor. An interlayer insulating film is constituted of at least lower and upper insulating layers and formed between the conductive coating and the source line. According to one aspect of the invention, an auxiliary capacitor is formed by the metal interconnection and the conductive coating serving as both electrodes and at least the lower insulating layer film serving as a dielectric. The auxiliary capacitor is formed in a region of the interlayer insulating film in which the upper insulating layer has been removed by etching. According to another aspect of the invention, the conductive coating has a portion that is in contact with the lower insulating layer in a region where the conductive coating coextends with the metal interconnection.

21 Claims, 10 Drawing Sheets